United States Patent [19]

Schiek et al.

[11] Patent Number: 5,442,296
[45] Date of Patent: Aug. 15, 1995

[54] METHOD FOR CALIBRATING A NETWORK ANALYZER

[75] Inventors: Burkhard Schiek, Bochum; Holger Heuermann, Witten, both of Germany

[73] Assignee: Rohde & Schwarz GmbH & Co. KG, Munich, Germany

[21] Appl. No.: 155,826

[22] Filed: Nov. 23, 1993

[30] Foreign Application Priority Data

Dec. 12, 1992 [DE] Germany .................. 42 42 023.7
Jan. 13, 1993 [DE] Germany .................. 43 00 610.8

[51] Int. Cl.[6] .................................. G01R 27/02
[52] U.S. Cl. .................................. 324/601; 324/638; 364/571.01
[58] Field of Search .................... 324/601, 637, 638; 364/571.01

[56] References Cited

U.S. PATENT DOCUMENTS

| | | | |
|---|---|---|---|
| 4,982,164 | 1/1991 | Schiek et al. | 324/638 |
| 5,097,215 | 3/1992 | Eul et al. | 324/601 |
| 5,313,166 | 5/1994 | Eul et al. | 324/601 |

OTHER PUBLICATIONS

"S-Parameter Test Adapter ZPV-Z5", Rohde & Schwarz data sheet, Germany, pp. 1-4 (not dated).
"16-Term Error Model And Calibration Procedure For On-Wafer Network Analysis Measurements", Butler et al., IEEE Transactions on Microwave Theory & Techniques, vol. 39, No. 12, Dec. 1991, pp. 211-2217.

*Primary Examiner*—Kenneth A. Wieder
*Assistant Examiner*—Glenn W. Brown
*Attorney, Agent, or Firm*—Hill, Steadman & Simpson

[57] ABSTRACT

For calibrating a network analyzer having two test ports by successive measurements of the transmission and the reflection parameters on a plurality of calibration standards in any desired order, from which correction values are then calculated that are taken into account in subsequent measurements of a device-under-test, at least five successive calibration measurements with predetermined calibration standards or calibration standards in the form of discrete components according to basic predetermined circuits are performed. A total of 15 correction values is then calculated from the measured values obtained with these calibration standards.

11 Claims, 3 Drawing Sheets

| PROCEDURE | TWO-PORT OR DOUBLE-ONE-PORT CALIBRATION STANDARDS | | | | | | |
|---|---|---|---|---|---|---|---|
| | 1. | 2. | 3. | 4. | 5. | 6. | 7. |
| TMSO | T | MM | SS | OO | SM SO MO | / | / |
| TMS | T | MM | SS | MS | SM | / | / |
| TMO | T | MM | OO | MO | OM | / | / |
| TMSU-6 | T | MM | SS | MS | UM | MU | / |
| TMOU-6 | T | MM | OO | MO | UM | MU | / |
| TMSU-7 | T | MM | SS | MU | UM | SU | US |
| TMOU-7 | T | MM | OO | MU | UM | OU | UO |

FIG. 6A
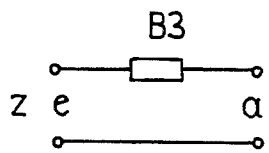
FIG. 6B
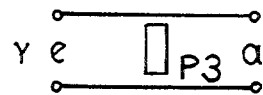
FIG. 6C
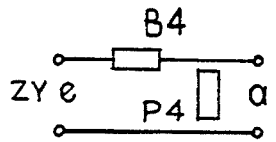
FIG. 6D
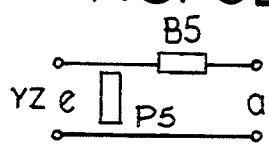
FIG. 6E
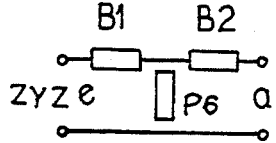
FIG. 6F
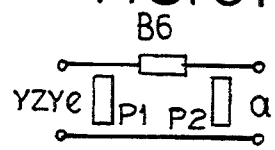
FIG. 7
| PROCEDURE | TWO-PORT OR DOUBLE-ONE-PORT CALIBRATION | | | | | | |
|---|---|---|---|---|---|---|---|
| | 1. | 2. | 3. | 4. | 5. | 6. | 7. |
| ZY-a | Z1 | Z2 | Y | ZY | YZ | / | / |
| ZY-b | Z | Y1 | Y2 | YZ | ZY | / | / |
| ZMO | Z | MM | OO | MO | OM | / | / |
| TMZY | T | MM | Z | Y | ZY | / | / |
| TOZY | T | OO | Y | YZ | ZY | / | / |
FIG. 8
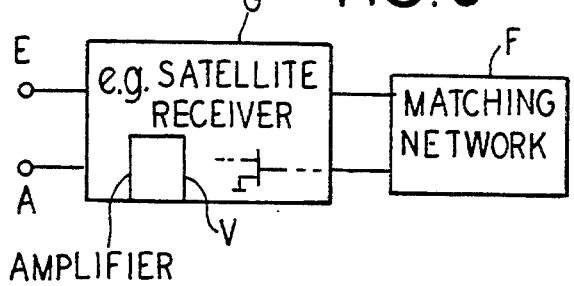

METHOD FOR CALIBRATING A NETWORK ANALYZER

BACKGROUND OF THE INVENTION

The present invention relates to a method of calibrating a network analyzer.

The measurement accuracy of network analyzers may be considerably improved by system error correction. Such system error corrections are obtained by calibration measurements which are realized in such a way that instead of the device under test (DUT) several calibration standards are successively connected between the two externally accessible test ports of the network analyzer where the transmission and reflection parameters will then be measured. The calibration measurement procedures used so far are based on a simplified two-error two-port model as disclosed in U.S. Pat. No. 4,982,164 which is hereby incorporated by reference.

FIG. 1 is the schematic circuit diagram of a commonly used network analyzer (for instance the network analyzer ZPV-Z5 of Rohde & Schwarz) in which a three-port 2, for example, a change-over switch, feeds two separate test circuits 12 and 13 from a radio frequency generator 1 capable of being tuned through a predetermined frequency range. The two test circuits 12 and 13 which are alternatingly turned on lead to four-ports 4 and 5 which are configured as bridges or directional couplers and which have signal detectors 8, 9 and 10, 11 respectively connected thereto by means of which voltage measurements as to magnitude and phase can be performed. These signal detectors may be mismatched. The four-ports 4 and 5 also have test ports 6 and 7 connected thereto between which a two-port 3 may be connected as the device under test (DUT). Hence, by way of the signal detectors 8, 9 and 10, 11 it is possible to measure the complex reflection factors $S_{11}$ and $S_{22}$ as well as the complex transmission factors $S_{12}$ and $S_{21}$ in forward and backward direction at the input and the output of an interconnected DUT 3. The four measured complex scattering parameters $S_{11}$, $S_{22}$, $S_{12}$ and $S_{21}$ fully describe a linear two-port for any frequency, and any further unknown quantities of interest may be determined from these values.

In accordance with the so-called two-error two-port model, several calibration standards instead of the DUT 3 are successively connected between the test ports 6 and 7 for calibrating purposes. In this way the scattering parameters are again obtained from which the correction values are calculated, which are stored in a memory in the network analyzer and used correspondingly for subsequent device testing.

However, this known error model for the usual two-port calibration is incomplete because it does not take into account any possible coupling between the components of a DUT to be calibrated. When so-called on-wafer networks (active or passive networks configured on semiconductor substrates) are calibrated it is necessary, for instance, to also include in the calibration measurement the coupling of the circuit portions existing between the test ports of the network analyzer and the actual DUT (for instance a transistor of the semiconductor circuit). This general calibration problem for the total error model is schematically illustrated in FIG. 2, the coupling between the components of the DUT and the externally accessible test ports 6 and 7 of the network analyzer, which coupling must not be neglected, is illustrated as an undefined free space which, as shown in FIG. 3, may be illustrated in terms of an error network C interconnected between the DUT 3 and the test ports 6 and 7.

The theory for solving the specified calibration problem is known (SPECIALE, R.A., A Generalization of the TSD Network analyzer Calibration Procedure, Covering n-Port Scattering-Parameter Measurements, Affected by Leakage Errors, IEEE Transactions on Microwave Theory and Techniques, MTT-25, December 1977, pp. 1100–1115). Based on the above theory it has already been proposed to solve the calibration problem with four successive calibration measurements (HEWLETT PACKARD, 16-Term Error Model and Calibration Procedure for On-Wafer Network Analysis Measurements, IEEE Transactions on Microwave Theory and Techniques, MTT-39, December 1991, pp. 2211–2217). The first calibration standard used is a direct or through-connection of the two test ports (through), the second calibration measurement is the concurrent connection of a reflection-free termination impedance to both test ports (so-called double-one-port calibration measurement Match-Match), the third calibration measurement comprised an open on one test port and a short on the other test port (double-one-port measurement Open-Short), and the fourth calibration measurement finally was the reverse sequence, i.e. a short on the first test port and an open on the second test port (double-one-port measurement Short-Open). This known 16-term calibration procedure, as it is called, will not yet completely solve the mentioned calibration problem since the successive four calibration measurements permit only 16 equations to be set up for error computation, and some of these equations are dependent on each other so that there are at most 14 independent equations whereby the problem cannot be solved.

SUMMARY OF THE INVENTION

It is therefore an object of the present invention to provide a method by which a fundamentally accurate solution of the above-specified general calibration problem is possible with little computational effort and which is also especially suitable for on-wafer measurements.

The above-specified objective is achieved by a method of the present invention for calibrating a network analyzer having two test ports by successive measurements of transmission and reflection parameters on a plurality of calibration standards in any desired order, from which correction values are then calculated that are taken into account in subsequent device-under-test measurements. The method has the following steps:

performing at least five successive calibration measurements using two-port calibration standards and using double one-port and/or two-port circuit configurations in one of the following calibration procedures, a first calibration procedure consisting of calibration measurements using calibration standards T, MM, SS, OO and one of SM, SO and MO, a second calibration procedure consisting of calibration measurements using calibration standards T, MM, SS, MS and SM, a third calibration procedure consisting of calibration measurements using calibration standards T, MM, OO, MO, OM, a fourth calibration procedure consisting of calibration measurements using calibration standards T, MM, SS, MS, UM, MU, a fifth calibration procedure consisting of calibration measurements using calibration standards T, MM, OO, MO, UM, MU, a sixth calibration procedure consisting of calibration measurements using calibration standards T, MM, SS, MU, UM, SU, US, and a seventh calibration procedure consisting of calibration measurements using calibration standards T, MM, OO, MU, UM, OU, UO, where T is a two-port standard for which all complex scattering parameters are known, where M is a one-port standard having a known reflection, where S is a one-port standard that is a short circuit, where O is a one-port standard that is an open circuit, where U is a one-port standard having an arbitrary unknown reflection, and where double letter designation of M, S, O and U refer to a double one-port standard with which the respective specified one-port measurements are successively performed on two test ports thereof as one calibration measurement, one or more of the following two-port circuit configurations being respectively substitutable for one or more of said double one-ports, a two-port having an arbitrary known impedance connected in series between an input and output thereof, a two-port having an impedance element connected in parallel with an input and output thereof, a two-port having a series-impedance element connected in series between an input and output thereof and having a parallel-impedance element connected in parallel to said output thereof, a two-port having a series-impedance element connected in series between an input and output thereof and having a parallel-impedance element connected in parallel to said input thereof, a two-port having a T-circuit composed of two series connected impedance elements and a parallel impedance element connected between an input and output thereof, a two-port having a π-circuit composed of a series impedance element and two parallel impedance elements connected between an input and output thereof; and calculating a total of 15 correction values from measured values obtained with the calibration standards.

In an advantageous development of the present invention, the two test ports of the network analyzer are configured as test probes for contacting conductors of a semiconductor circuit.

For optimizing a transient response characteristic of a complex electrical overall circuit between an input and output thereof by optimizing transmission characteristics of a selected portion of such overall circuit, the method further has the following steps: successively replacing arithmetically the selected circuit portion to be optimized by the at least five calibration standards and calculating a total of 15 parameters of the remaining overall circuit from the thus obtained calculated values; and subsequently, by the use of these 15 correction values which accurately define the characteristics of the remaining circuit, altering the transient response characteristic of the overall circuit between the input and output thereof by mathematical use of the circuit portion with variable parameters until a desired optimum transient response characteristic has been obtained; and then implementing the circuit portion having resulting optimum parameters by calculation.

In the method of the present invention at least five instead of only four calibration measurements are performed in succession, whereby it is possible to obtain a total of 20 equations of which at least 15 are independent of each other so that the above-mentioned calibration problem is basically accurately solved. This results in a simple method for use in practice to determine the correction coefficients for the overall calibration model of such network analyzers. For example, it is thereby possible also to perform on-wafer measurements at high transmission dynamics while the required calculation time is negligible. Since it is possible with the method of the present invention to calculate a total of 15 correction coefficients the method is called 15-term calibration procedure.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 6A-6F depict various circuit configurations of impedance elements that are used as two-port calibration standards;

FIG. 7 is a table depicting some examples of the use of the FIGS. 6A-6F calibration standards in calibration procedures; and FIG. 8 is a block diagram depicting one example of the method of the present invention for optimizing the transient response characteristic of a complex overall electrical circuit.

DESCRIPTION OF THE PREFERRED EMBODIMENT

The method of the present invention is especially suited for measurements of on-wafer networks (MMIC). For such measurements the test ports 6 and 7 of the network analyzer are configured, as illustrated in FIG. 4, as slender test probes 16 and 17 which are disposed at an extremely small distance of just a few microns from each other when a DUT is to be measured.

Figure 1:
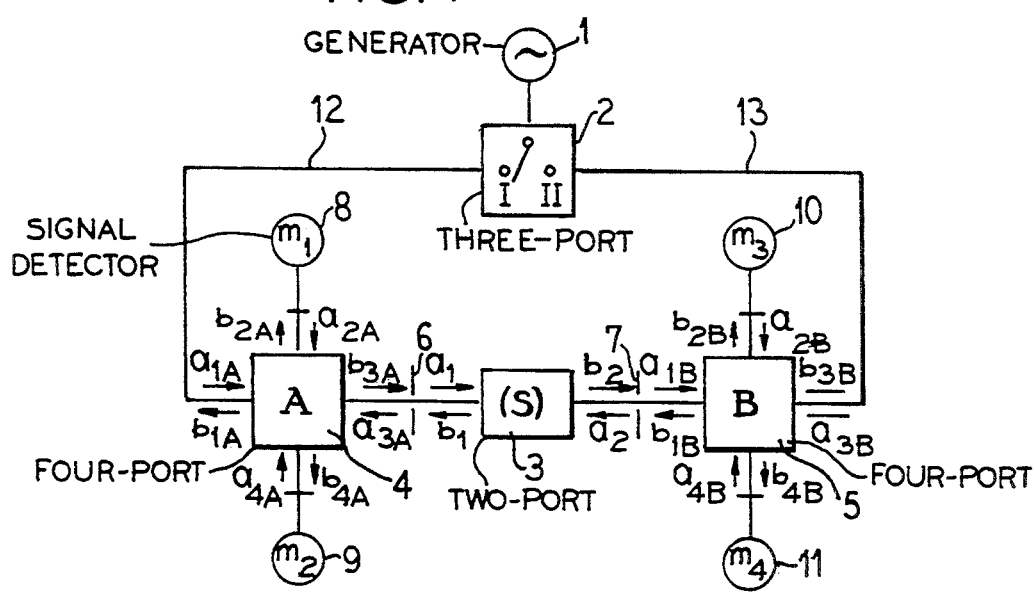
FIG. 1 is a block diagram depicting a network analyzer that is calibrated by the method of the present invention.
Figure 2:
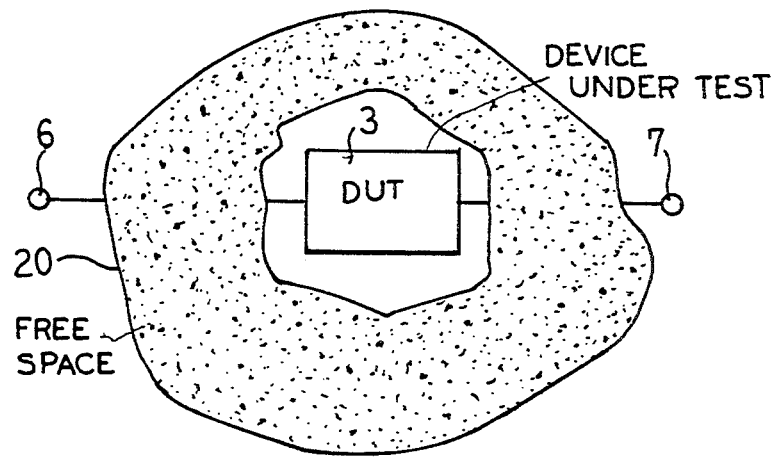
FIG. 2 schematically depicts the calibration problem due to effects on the device under test from the free space surrounding the device.
Figure 3:
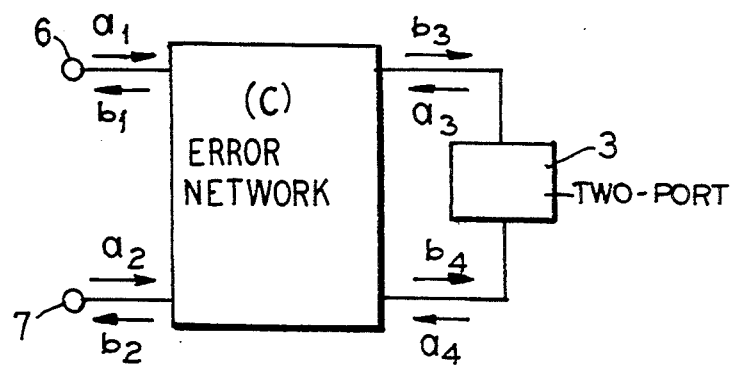
FIG. 3 is a block diagram depicting the connection of an error network to the two-port connected to the network analyzer.
Figures 4, 5:
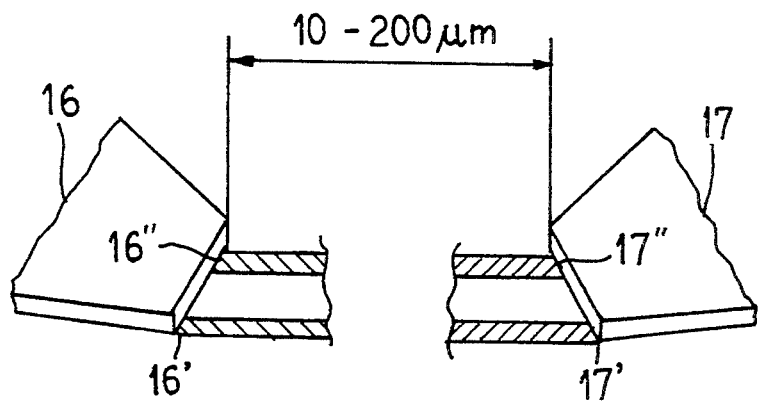
FIG. 4 is a perspective view of a portion of test probes which are used as test ports of a network analyzer.
FIG. 5 is a table listing two-port and double-one-port calibration standard combinations of different calibration procedures.

FIG. 4 shows that the four contact sites 16', 16'', 17', 17'' of the test probes 16 and 17 are closely adjacent the conductors of the semiconductor substrate and are therefore strongly coupled to each other, whereby the measuring dynamics for reflection and transmission measurements is limited to approximately 20 db. In contrast, prior art coaxial test sockets of the test ports 6 and 7 achieve 60 db dynamics for reflection measurements and 100 db dynamics for transmission measurements. But if, in accordance with the present invention, the above-mentioned coupling is determined through the error network C shown in FIG. 3, it will be possible to also accurately calculate the scattering parameters of such an inaccessible DUT from the obtained measurement values, and high dynamics may also be achieved for on-wafer measurements.

According to a further improvement of the present invention the 15-term calibration method may also be used purely mathematically for optimizing the transient response characteristic of a complex overall electrical circuit, where the method steps are applied again purely mathematically, but in this case merely numerically in a computer. From these calculated values a total of 15 parameters are again obtained which correspond to the correction values of the calibration method. In this way it is possible to easily calculate a sub-circuit of a complex overall electronic circuit, which is to be optimized in respect of the transient response characteristic of the overall circuit. Only five discrete calculation steps are required on the basis of the mathematically utilized calibration standards. From the obtained calculated values it will then be possible in turn to calculate a total of 15 parameters by which the remaining overall circuit (without the sub-circuit to be optimized) with all its parameters is accurately defined. Subsequently, it will only be required in the calculation to substitute the calibration standards again by various scattering parameters of the sub-circuit to be incorporated in the overall circuit and to calculate the transient response characteristic of the overall circuit by means of the parameters which accurately define the remaining overall circuit. By varying these scattering parameters of the sub-circuit it is then possible to determine those scattering parameter values by which the desired optimum transient response characteristic of the overall circuit is achieved. Based on these scattering parameters of the sub-circuit it is then very easy to implement in a known way the circuit design with the desirable, mathematically established properties. Such calculations are quickly performed. Only milliseconds are required for the successive mathematical alterations of the scattering parameters of the sub-circuit. Therefore the optimizing procedure according to the present invention is considerably faster than the previously used analysis procedures in which the overall circuit with all its parameters is altered with the help of a large computer which frequently requires several hours' computing time.

The starting point for the mathematical description of the 15-term calibration method is constituted by the error model of FIG. 3. For simplicity's sake the mathematical derivation is performed only for the case of two-port calibration, which is the most interesting case for practical purposes. Generalization of this procedure to any desired number of n-ports may be performed in the same manner, and hence the method according to the present invention is not only suited for calibrating network analyzers with two test ports but also for those having, for example, three, four or more test ports.

It is advantageous to set up the mathematical formulation of the complete model in transmission parameters as follows:

$$\begin{pmatrix} a_1 \\ a_2 \\ b_1 \\ b_2 \end{pmatrix} = [C]^{-1} \begin{pmatrix} a_3 \\ a_4 \\ b_3 \\ b_4 \end{pmatrix}, \qquad (2)$$

or, respectively, $$[C] \begin{pmatrix} a_1 \\ a_2 \\ b_1 \\ b_2 \end{pmatrix} = \begin{pmatrix} a_3 \\ a_4 \\ b_3 \\ b_4 \end{pmatrix}. \qquad (3)$$

The 4*4 matrix [C] is decomposed into four 2*2 matrices as follows:

$$[C] = \begin{pmatrix} [A] & [E] \\ [F] & [B] \end{pmatrix} \qquad (4)$$

for equation (3):

$$[A]\begin{pmatrix} a_1 \\ a_2 \end{pmatrix} + [E]\begin{pmatrix} b_1 \\ b_2 \end{pmatrix} = \begin{pmatrix} a_3 \\ a_4 \end{pmatrix}, \qquad (5)$$

$$[B]\begin{pmatrix} b_1 \\ b_2 \end{pmatrix} + [F]\begin{pmatrix} a_1 \\ a_2 \end{pmatrix} = \begin{pmatrix} b_3 \\ b_4 \end{pmatrix}. \qquad (6)$$

The following relationship in scattering parameters holds for the DUT:

$$\begin{pmatrix} a_3 \\ a_4 \end{pmatrix} = [S]\begin{pmatrix} b_3 \\ b_4 \end{pmatrix}. \qquad (7)$$

Substituting the matrix equations (5) and (6) in equation $$[A]\begin{pmatrix} a_1 \\ a_2 \end{pmatrix} + [E]\begin{pmatrix} b_1 \\ b_2 \end{pmatrix} = [SB]\begin{pmatrix} b_1 \\ b_2 \end{pmatrix} + [SF]\begin{pmatrix} a_1 \\ a_2 \end{pmatrix}. \qquad (8)$$

in which $$[SB] = [S][B], \quad [SF] = [S][F]. \qquad (9)$$

Dissolving the brackets, for example, for [SB]:

$$[SB] = \begin{pmatrix} S_{11}B_{11} + S_{12}B_{21} & S_{11}B_{12} + S_{12}B_{22} \\ S_{21}B_{11} + S_{22}B_{21} & S_{21}B_{12} + S_{22}B_{22} \end{pmatrix}. \qquad (10)$$

With equation (8) there are two conditional equations available for a double-one-port or two-port calibration standard for one switch position.

$$A_{11}c_1 + A_{12}a_2 + E_{11}b_1 + E_{12}b_2 - SB_{11}b_1 - SB_{12}b_2 - SF_{11}a_1 - SF_{12}a_2 = 0 \qquad (11)$$

$$A_{21}a_1 + A_{22}a_2 + E_{21}b_1 + E_{22}b_2 - SB_{21}b_1 - SB_{22}b_2 - SF_{21}a_1 - SF_{22}a_2 = 0 \quad (12)$$

The second switch position additionally supplies two further equations.

It is readily apparent that every conditional equation has only one reflection value ($S_{11}$ or $S_{21}$). This fact is the key to the TMXU-calibration methods. A calibration measurement with a completely known double-one-port (which consists of two one-ports considered as a two-port without transmission) normally supplies four useful equations. In contrast, a measurement with one known and one unknown one-port calibration standard supplies only two equations, i.e. the two equations in which the reflection factor of the known standard is contained.

In order to obtain system error-corrected values for any two-port one will require only 15 equations, because one term of the error network may be fixed to a random finite value. This will be proven after the introduction of the correction calculation.

By fixing one parameter of the error network one obtains a set of linear inhomogeneous equations (matrix equation (13) based on equation (8)) for the remaining 15 error parameters, which set is readily solved by inverting the 15*15 matrix (MX) composed of measured values and the parameters of the calibration objects.

$$[MX] \begin{pmatrix} A_{12} \\ A_{21} \\ A_{22} \\ E_{11} \\ E_{12} \\ E_{21} \\ E_{22} \\ B_{11} \\ B_{12} \\ B_{21} \\ B_{22} \\ F_{11} \\ F_{12} \\ F_{21} \\ F_{22} \end{pmatrix} = (MY) \quad (13)$$

Thus, it appears that only four calibration measurements with completely known two-ports or double-one-ports are required for determining the fifteen unknown error network coefficients. The fact that five calibration measurements are required is due to the occurrence of dependent equations. A study of the rank of the set of calibration equations has shown that what is required is either five measurements with three or four completely known calibration standards (TMS, TMO, TMSO) or six or seven measurements with three known standards (TMSU, TMOU), respectively.

FIG. 5 is a table listing two-port and double-one-port calibration standard combinations of the three calibration methods. In the TMSO-procedure it would also be possible to replace all five standard combinations by completely known two-port calibration standards (for instance so-called transfer standards).

Having determined the error parameters it is desirable to correct the measurement values of any desired DUT in respect to mismatching, cross-talk and similar measurement errors. This part of the system error correction is generally known as correction calculation.

Contrary to calculating the error parameters, this correction calculation is frequently performed and should therefore require little time.

Derivation of the mentioned correction calculation is based on a combination of equation (8) for the first and the second positions of the switch when calibrating the unknown device:

$$[A][M_a] + [E][M_b] = [S_x]([B][M_b] + [F][M_a]), \quad (14)$$

with the measured value matrices:

$$[M_a] = \begin{pmatrix} a_1' & a_1'' \\ a_2' & a_2'' \end{pmatrix}, [M_b] = \begin{pmatrix} b_1' & b_1'' \\ b_2' & b_2'' \end{pmatrix}. \quad (15)$$

Equation (14) may be rearranged for the unknown scattering parameters ($[S_x]$):

$$[S_x] = ([A][M_a] + [E][M_b])([B][M_b] + [F][M_a])^{-1}. \quad (16)$$

If in equation (15) all error parameters of the four error matrices [A], [E], [B] and [F] are set in relation to $A_{11}$, $A_{11}$ in correction equation (16) is cancelled out on account of the inversion. Equation (16) now offers a means for correction calculation in which only 2*2 matrices are used. Therefore this calculation is very short when compared to the calculation of the error parameters (inversion of a 15*15 matrix). As regards the time consumed for calculations it is comparable with other correction calculations of other procedures. What is interesting in equation (16) is that there occurs only an inversion (and hence only one possible problem of singularity) of a 2*2 matrix whose elements due to their complexity are most probably other than zero.

The table of FIG. 5 lists the various possibilities for the calibration measurement with at least five and in some cases even six or seven calibration standards T, M, S, O and U, respectively, where:

T is a two-port of which all complex scattering parameters are known. (Preferentially, this is a direct or through-connection between the two test ports 6 and 7 of the network analyzer);

M is a one-port of known reflection;

S is a short, or a known reflection in the vicinity of a short;

O is an open, or a known reflection in the vicinity of an open; and

U is a one-port of arbitrary unknown reflection.

The double-letters MM, SS, OO or SO etc. respectively designate a so-called double-one-port calibration standard by means of which the respective specified one-port measurements (e.g. M, S, O or the like) are successively performed on the two test ports 6 and 7 as a single calibration measurement.

FIGS. 6A–6F show the various basic circuit diagrams for the calibration method. The calibration standards illustrated here as two-ports, are constituted by impedance elements which are implemented in the form of discrete components. The table of FIG. 7 explains some ways of performing, for instance in five successive calibration measurements with such calibration standards listed in FIGS. 6A–6F in any desired combination, at least five successive calibration measurements. The table of FIG. 7 is merely a portion of a multiplicity of such possible combinations. The impedance circuit Z of FIG. 6A is a simple two-port in which a random known impedance element B3 is connected in series between the input e and the output a. In the calibration standard Y of FIG. 6B an impedance element P3 is connected in parallel with the input e and the output a of the two-port. The calibration standard ZY of FIG. 6C consists of a typical L-circuit with a series-impedance element B4 and a parallel-impedance element P4 connected in parallel to the output a. The calibration standard YZ of FIG. 6D is inversely composed of a series resistance B5 and a parallel-impedance element P5 connected in parallel with the input e. The calibration standard ZYZ of FIG. 6E is implemented as a T-circuit having two series-connected impedance elements B1 and B2 and a parallel impedance element P6 connected therebetween. The sixth calibration standard YZY of FIG. 6F is configured as a $\pi$-circuit having a series impedance element B6 and two parallel impedance elements P1 and P2 connected in parallel with the input and output, respectively.

FIG. 8 is an example of the method of optimizing the transient response characteristic of a complex overall electrical circuit G between the input E and the output A thereof. This may for instance be a satellite receiver in the 10 GHz range. In this complex overall circuit G an amplifier V is incorporated which by means of a matching network F is to be matched to the remaining circuit such that a predetermined transient response characteristic between input E and output A of the overall circuit is achieved. The amplifier V is incorporated in a highly complex overall circuit G in which a multiplicity of circuit components are coupled to each other through the free space.

The calculation of the output value at the output A with a given input value at the input E by means of a large computer would require several hours depending on the degree of complexity of the overall circuit. In accordance with the present invention, however, the calculation is performed with only five successive calibration standards which instead of the matching network F are included in a total calculation of the overall circuit G, i.e. the calibration standards are not physically connected as in the case of the calibration measurement procedure of a network analyzer according to the previous description, but their known scattering parameters are taken into account only mathematically. In this way the parameters are calculated successively in a relatively short calculation operation with only five calibration standards, from which it is then possible to calculate a total of 15 equations for the remaining overall circuit G whereby the remaining overall circuit G will then be accurately defined. The calibration standards may either be those of FIG. 5 or those of FIG. 6A–6F and FIG. 7, or again those of FIG. 5 in which, however, the double-one-ports specified therein (e.g. MM, SS or the like) are replaced by any desired impedance element according to FIGS. 6A–6F and 7.

Following the calculation of the complex remaining basic circuit G as a network with 15 terms, the circuit is defined accurately and it is subsequently possible (instead of using a time-consuming numerical analysis program) within only milliseconds to calculate with the 15 established parameters in a simple calculation the output value A in response to the input value E for randomly introduced scattering parameters of any desired matching network F. The mathematically introduced scattering parameters of the matching network may be altered as often as desired because, as has been set out, the calculation may be performed very quickly.

It is therefore possible in this way to optimize a matching network F such that the overall circuit between input E and output A exhibits a predetermined transient response characteristic. From the established optimized scattering parameters of the matching network it is then possible to also implement in a known way the circuitry for the matching network F for the amplifier V.

The term "transient response characteristic of the overall circuit" is generally intended to mean the relationship between the radio frequency signal at the input E and the output signal at the output A. Hence, the method of the present invention is universally suited for any desired optimization of circuit dimensions.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for calibrating a network analyzer having two test ports by successive measurements of transmission and reflection parameters on a plurality of calibration standards in any desired order, from which correction values are then calculated that are taken into account in subsequent device-under-test measurements, comprising the steps of:

performing at least five successive calibration measurements in calibration procedures with calibration standards as follows, a first calibration procedure consisting of calibration measurement using calibration standards T, MM, SS, OO and one of SM, SO and MO, a second calibration procedure consisting of calibration measurement using calibration standards T, MM, SS, MS and SM, a third calibration procedure consisting of calibration measurement using calibration standards T, MM, OO, MO, OM, a fourth calibration procedure consisting of calibration measurement using calibration standards T, MM, SS, MS, UM, MU, a fifth calibration procedure consisting of calibration measurement using calibration standards T, MM, OO, MO, UM, MU, a sixth calibration procedure consisting of calibration measurement using calibration standards T, MM, SS, MU, UM, SU, US, and a seventh calibration procedure consisting of calibration measurement using calibration standards T, MM, OO, MU, UM, OU, UO, where T is a two-port standard for which all complex scattering parameters are known, where M is a one-port standard having a known reflection, where S is a one-port standard that is a short circuit, where O is a one-port standard that is an open circuit, where U is a one-port standard having an arbitrary unknown reflection, and where double letter designation of M, S, O and U refer to a double one-port standard with which the respective specified one-port measurements are successively performed on the two test ports thereof as one calibration measurement, calculating a total of 15 correction values from measured values obtained with said calibration standards.

2. The method as claimed in claim 1, wherein said two test ports of said network analyzer are configured as test probes for contacting conductors of a semiconductor circuit.

3. The method as claimed in claim 1, wherein for optimizing a transient response characteristic of a complex electrical overall circuit between an input and output thereof by optimizing transmission characteristics of a selected portion of such overall circuit, the method further comprising the steps of:

successively replacing arithmetically the selected circuit portion to be optimized by said at least five calibration standards and calculating a total of 15 parameters of the remaining overall circuit from the thus obtained calculated values; and subsequently, by the use of these 15 correction values which accurately define the characteristics of the remaining circuit, altering the transient response characteristic of the overall circuit between the input and output thereof by mathematical use of the circuit portion with variable parameters until a desired optimum transient response characteristic has been obtained; and then implementing the circuit portion having resulting optimum parameters by calculation.

4. The method as claimed in claim 1, wherein T is a two-port standard having a direct contact between an input and output thereof.

5. A method for calibrating a network analyzer having two test ports by successive measurements of transmission and reflection parameters on a plurality of calibration standards in any desired order, from which correction values are then calculated that are taken into account in subsequent device-under-test measurements, comprising the steps of:

performing at least five successive calibration measurements with calibration standards having impedance elements in the form of discrete components and used in any desired order and combination, the calibration standards selected from the following two-port circuit configurations, a two-port having an arbitrary known impedance connected in series between an input and output thereof, a two-port having an impedance element connected in parallel with an input and output thereof, a two-port having a series-impedance element connected in series between an input and output thereof and having a parallel-impedance element connected in parallel to said output thereof, a two-port having a series-impedance element connected in series between an input and output thereof and having a parallel-impedance element connected in parallel to said input thereof, a two-port having a T-circuit composed of two series connected impedance elements and a parallel impedance element connected between an input and output thereof, a two-port having a $\pi$-circuit composed of a series impedance element and two parallel impedance elements connected between an input and output thereof; and calculating a total of 15 correction values from measured values obtained with said calibration standards.

6. The method as claimed in claim 5, wherein said two test ports of said network analyzer are configured as test probes for contacting conductors of a semiconductor circuit.

7. The method as claimed in claim 5, wherein for optimizing a transient response characteristic of a complex electrical overall circuit between an input and output thereof by optimizing transmission characteristics of a selected portion of such overall circuit, the method further comprising the steps of:

successively replacing arithmetically the selected circuit portion to be optimized by said at least five calibration standards and calculating a total of 15 parameters of the remaining overall circuit from the thus obtained calculated values; and subsequently, by the use of these 15 correction values which accurately define the characteristics of the remaining circuit, altering the transient response characteristic of the overall circuit between the input and output thereof by mathematical use of the circuit portion with variable parameters until a desired optimum transient response characteristic has been obtained; and then implementing the circuit portion having resulting optimum parameters by calculation.

8. A method for calibrating a network analyzer having two test ports by successive measurements of transmission and reflection parameters on a plurality of calibration standards in any desired order, from which correction values are then calculated that are taken into account in subsequent device-under-test measurements, comprising the steps of:

performing at least five successive calibration measurements using two-port calibration standards and using double one-port and/or two-port circuit configurations in one of the following calibration procedures, a first calibration procedure consisting of calibration measurements using calibration standards T, MM, SS, OO and one of SM, SO and MO, a second calibration procedure consisting of calibration measurements using calibration standards T, MM, SS, MS and SM, a third calibration procedure consisting of calibration measurements using calibration standards T, MM, OO, MO, OM, a fourth calibration procedure consisting of calibration measurements using calibration standards T, MM, SS, MS, UM, MU, a fifth calibration procedure consisting of calibration measurements using calibration standards T, MM, OO, MO, UM, MU, a sixth calibration procedure consisting of calibration measurements using calibration standards T, MM, SS, MU, UM, SU, US, and a seventh calibration procedure consisting of calibration measurements using calibration standards T, MM, OO, MU, UM, OU, UO, where T is a two-port standard for which all complex scattering parameters are known, where M is a one-port standard having a known reflection, where S is a one-port standard that is a short circuit, where O is a one-port standard that is an open circuit, where U is a one-port standard having an arbitrary unknown reflection, and where double letter designation of M, S, O and U refer to a double one-port standard with which the respective specified one-port measurements are successively performed on two test ports thereof as one calibration measurement, one or more of the following two-port circuit configurations being respectively substitutable for one or more of said double one-ports, a two-port having an arbitrary known impedance connected in series between an input and output thereof, a two-port having an impedance element connected in parallel with an input and output thereof, a two-port having a series-impedance element connected in series between an input and output thereof and having a parallel-impedance element connected in parallel to said output thereof, a two-port having a series-impedance element connected in series between an input and output thereof and having a parallel-impedance element connected in parallel to said input thereof, a two-port having a T-circuit composed of two series connected impedance elements and a parallel impedance element connected between an input and output thereof, a two-port having a $\pi$-circuit composed of a series impedance element and two parallel impedance elements connected between an input and output thereof; and calculating a total of 15 correction values from measured values obtained with said calibration standards.

9. The method as claimed in claim 8, wherein said two test ports of said network analyzer are configured as test probes for contacting conductors of a semiconductor circuit.

10. The method as claimed in claim 9, wherein for optimizing a transient response characteristic of a complex electrical overall circuit between an input and output thereof by optimizing transmission characteristics of a selected portion of such overall circuit, the method further comprising the steps of:

successively replacing arithmetically the selected circuit portion to be optimized by said at least five calibration standards and calculating a total of 15 parameters of the remaining overall circuit from the thus obtained calculated values; and subsequently, by the use of these 15 correction values which accurately define the characteristics of the remaining circuit, altering the transient response characteristic of the overall circuit between the input and output thereof by mathematical use of the circuit portion with variable parameters until a desired optimum transient response characteristic has been obtained; and then implementing the circuit portion having resulting optimum parameters by calculation.

11. The method as claimed in claim 8, wherein T is a two-port standard having direct contact between an input and output thereof.

* * * * *